US012153072B1

United States Patent
Chen et al.

(10) Patent No.: US 12,153,072 B1
(45) Date of Patent: Nov. 26, 2024

(54) METHOD AND APPARATUS FOR MONITORING CURRENT OF GROUND WIRE OF ARMOURING SHIELDING CABLE IN STRONG ELECTROMAGNETIC ENVIRONMENT

(71) Applicant: STATE GRID NANJING SUPPLY POWER COMPANY, Jiangsu (CN)

(72) Inventors: Hao Chen, Jiangsu (CN); Mai Xiao, Jiangsu (CN); Honghua Xu, Jiangsu (CN); Bing Xia, Jiangsu (CN); Zichang Sun, Jiangsu (CN); Ruowei Zhang, Jiangsu (CN); Zhangying Li, Jiangsu (CN); Chunyan Ma, Jiangsu (CN); Chi Xu, Jiangsu (CN)

(73) Assignee: State Grid Nanjing Supply Power Company, Jiangsu (CN)

( * ) Notice: Subject to any disclaimer, the term of this patent is extended or adjusted under 35 U.S.C. 154(b) by 0 days.

(21) Appl. No.: 18/692,241

(22) PCT Filed: Dec. 29, 2023

(86) PCT No.: PCT/CN2023/143110
§ 371 (c)(1),
(2) Date: Mar. 14, 2024

(30) Foreign Application Priority Data

Jul. 20, 2023 (CN) .......................... 202310893346.8

(51) Int. Cl.
*G01R 19/00* (2006.01)
(52) U.S. Cl.
CPC .................. *G01R 19/0092* (2013.01)
(58) Field of Classification Search
None
See application file for complete search history.

(56) References Cited

U.S. PATENT DOCUMENTS 5,077,526 A    12/1991    Vokey et al.
7,915,898 B1 *    3/2011    Kraemer ............ G01R 29/0835
                                                       324/627

(Continued)

FOREIGN PATENT DOCUMENTS

CN        103389437 A      11/2013
CN        205263186 U       5/2016

(Continued)

OTHER PUBLICATIONS

"Design and Application of Comprehensive Monitoring and Early Warning System for 10kV 1Armored Cables," Zhou Shijie(Guangzhou Power Supply Bureau Co., Ltd. Nansha Power Supply Bureau Guangzhou, Guangdong, 510000) "Automation and Instrumentation" Issue 12, 2017 (Total Issue 218).

(Continued)

*Primary Examiner* — Dominic E Hawkins
(74) *Attorney, Agent, or Firm* — CM Law; Stephen J. Weed

(57) ABSTRACT

Provided are a method and apparatus for monitoring a current of the ground wire of an armouring shielding cable in a strong electromagnetic environment. In the method, a summation of currents of the ground wires in the armouring layer and a summation of currents of the ground wires in the shielding layer of M cables in a terminal box are collected, and a primary ground copper busbar potential and a secondary ground copper busbar potential of the terminal box and a ground current of an adjacent terminal box are collected; a potential difference alarm can be achieved; and according to whether a potential difference is alarmed, terminal box cable loop loop-current alarms are performed respectively using different criteria.

13 Claims, 3 Drawing Sheets

(56) References Cited

U.S. PATENT DOCUMENTS

| | | | | |
|---|---|---|---|---|
| 9,297,864 B2* | 3/2016 | Cortes | ................ | G01R 33/0011 |
| 2023/0108660 A1* | 4/2023 | Bradley | ................ | H02H 9/041 |
| | | | | 361/91.6 |
| 2023/0296657 A1* | 9/2023 | Bradley | ............ | G01R 29/0878 |
| | | | | 324/76.11 |

FOREIGN PATENT DOCUMENTS

| | | | |
|---|---|---|---|
| CN | 110850238 A | 2/2020 | |
| CN | 111458607 A | 7/2020 | |
| CN | 113030782 A | 6/2021 | |
| CN | 115407241 A | 11/2022 | |
| CN | 115718867 A | 2/2023 | |
| CN | 116125330 A | 5/2023 | |
| CN | 116381379 A | 7/2023 | |
| CN | 116381551 A | 7/2023 | |
| GB | 1466306 | 3/1977 | |
| JP | H06289094 A | 10/1994 | |

OTHER PUBLICATIONS

1st Chinese Office Action for Chinese Application No. 202310893346.8, dated Aug. 25, 2023, (Aug. 25, 2023)—3 pages (English translation, 5 pages).

2nd Chinese Office Action for Chinese Application No. 202310893346.8, dated Sep. 8, 2023 (Sep. 8, 2023)—3 pages (English translation, 4 pages).

\* cited by examiner

METHOD AND APPARATUS FOR MONITORING CURRENT OF GROUND WIRE OF ARMOURING SHIELDING CABLE IN STRONG ELECTROMAGNETIC ENVIRONMENT

CROSS-REFERENCES TO RELATED APPLICATIONS

This is a National Stage Application, filed under 35 U.S.C. 371, of International Patent Application No. PCT/CN2023/143110, filed on Dec. 29, 2023, which is based on and claims priority to Chinese Patent Application No. 202310893346.8 filed with the China National Intellectual Property Administration (CNIPA) on Jul. 20, 2023, the disclosure of which is incorporated herein by reference in its entirety.

TECHNICAL FIELD

The present application belongs to the field of on-line monitoring of electrical equipment and circuits in substations and, for example, relates to a method and apparatus for monitoring a current of ground wire of an armouring shielding cable in a strong electromagnetic environment.

BACKGROUND

Ultra-high-voltage substations widely adopt dry-type air-core reactors. The magnetic flux leakage of the dry-type air-core reactor causes the occurrence of a local strong magnetic region in the substation, and when a loop occurs around such a region, the magnetic flux leakage causes the formation of a loop current, resulting in heating and even cable burning. In recent years, accidents such as heating and burning of cables and heating and smoking of ground grids occur in the vicinity of the dry-type reactor in the 220 kV or above substation, posing a great danger to the safe and stable operation of the substation. The cables in the terminal box near the reactor are dense and prone to causing current loops, and when the terminal box near the reactor is within the range of strong electromagnetic pulse interference, a transient strong electromagnetic radiation environment with an electric field intensity of more than 1 kV/m is formed. Therefore, monitoring the cables in the terminal box in a strong electromagnetic environment is necessary and beneficial.

The armouring shielding cable monitoring for the substation in a strong electromagnetic environment mainly includes a manual visual inspection method. Currently, there is no special monitoring means for the ground wire of an armouring shielding secondary cable, and conventionally, the monitoring is performed through manual visual inspection by substation operation and maintenance personnel, for example, during the checking of the terminal box, observing the cables and the ground wires to check whether there is any abnormal appearance and whether there is a burnt smell. An infrared temperature measurement method is also used. The substation operation and maintenance personnel perform infrared temperature measurements on the armouring shielding cable and the related ground wires by using a hand-held infrared temperature measurement device to check whether the temperatures of the cables and the ground wires as well as the related connection parts are too high. For the above methods, the non-real-time characteristics cannot be avoided. Both the manual visual inspection method and the infrared temperature measurement method require manual inspection and are performed within the terminal box or protection screen near the ground wire. Even for a 1000 kV ultra-high-voltage substation with a high inspection frequency, inspection can only be performed once or twice a day, and the highest inspection frequency of the power supply guarantee task is four times a day. Therefore, a period of a few hours between two inspections is sufficient for the whole process of the cable from being abnormally heated to being on fire. The monitoring accuracy of the above method is poor. Whether the faults can be found is related to the skill level and mental status of the operation and maintenance personnel and the stage of fault development. Therefore, it is difficult to detect the fault accurately. The infrared temperature measurement method is slightly less affected by subjective factors compared with the manual visual inspection method but is still affected by whether the temperature measurement location is shielded and depends on the current stage of fault development at the time of temperature measurement. Therefore, the probability that the fault is accurately detected is not high.

SUMMARY

The present application provides a method for monitoring a current of the ground wire of an armouring shielding cable in a strong electromagnetic environment to monitor currents of the ground wires of M armouring shielding cables in a terminal box. The method includes the following steps.

A summation of currents of the ground wires in the armouring layer and a summation of currents of the ground wires in the shielding layer of M cables in a terminal box are collected, and a primary ground copper busbar potential and a secondary ground copper busbar potential of the terminal box and a ground current of an adjacent terminal box are collected.

A potential difference is acquired using the collected primary ground copper busbar potential and the collected secondary ground copper busbar potential, and in response to determining that the potential difference is greater than or equal to a potential difference alarm value, a potential difference alarm is performed; when the potential difference is not alarmed, in response to determining that the summation of currents of the ground wires in the armouring layer and the summation of currents of the ground wires in the shielding layer are greater than or equal to corresponding overcurrent alarm values, respectively, and that the sum of the summation of currents of the ground wires in the armouring layer and the summation of currents of the ground wires in the shielding layer is less than or equal to a loop current alarm value, a terminal box cable loop loop-current alarm is performed; when the potential difference is alarmed, the overcurrent alarm values and the loop current alarm value are corrected, and in response to determining that the summation of currents of the ground wires in the armouring layer and the summation of currents of the ground wires in the shielding layer are greater than or equal to the corrected overcurrent alarm values, respectively, and that the sum of the summation of currents of the ground wires in the armouring layer and the summation of currents of the ground wires in the shielding layer is less than or equal to the corrected loop current alarm value, a terminal box cable loop loop-current alarm is performed.

In response to determining that the ground current of the adjacent terminal box is greater than or equal to a first current alarm value, a ground current alarm value of the terminal box is set to a first value; in response to determining that the ground current of the adjacent terminal box is greater than or equal to a second current alarm value and a ground current increment of the adjacent terminal box is greater than or equal to a current increment alarm value, the ground current alarm value of the terminal box is set to a second value; in response to determining that a ground current of the terminal box is greater than the ground current alarm value, a terminal box ground current alarm is performed; where the first current alarm value is greater than the second current alarm value.

The present application further provides an apparatus for monitoring a current of the ground wire of an armouring shielding cable in a strong electromagnetic environment. The apparatus includes a collection module, a monitoring module, and an alarm module.

The collection module is configured to collect a summation of currents of the ground wires in the armouring layer and a summation of currents of the ground wires in the shielding layer of M cables in a terminal box and collect a primary ground copper busbar potential and a secondary ground copper busbar potential of the terminal box and a ground current of an adjacent terminal box.

The monitoring module includes a potential difference alarm unit, a terminal box ground current alarm unit, a cable ground wire overcurrent alarm unit, and a cable loop loop-current alarm unit.

The potential difference alarm unit is configured to acquire a potential difference using the collected primary ground copper busbar potential and the collected secondary ground copper busbar potential, and in response to determining that the potential difference is greater than or equal to a potential difference alarm value, call the alarm module to perform a potential difference alarm.

The cable loop loop-current alarm unit is configured to, when the potential difference is not alarmed, in response to determining that the summation of currents of the ground wires in the armouring layer and the summation of currents of the ground wires in the shielding layer are greater than or equal to corresponding overcurrent alarm values, respectively, and that the sum of the summation of currents of the ground wires in the armouring layer and the summation of currents of the ground wires in the shielding layer is less than or equal to a loop current alarm value, call the alarm module to perform a terminal box cable loop loop-current alarm; when the potential difference is alarmed, correct the overcurrent alarm values and the loop current alarm value, and in response to determining that the summation of currents of the ground wires in the armouring layer and the summation of currents of the ground wires in the shielding layer are greater than or equal to the corrected overcurrent alarm values, respectively, and that the sum of the summation of currents of the ground wires in the armouring layer and the summation of currents of the ground wires in the shielding layer is less than or equal to the corrected loop current alarm value, call the alarm module to perform a terminal box cable loop loop-current alarm.

The terminal box ground current alarm unit is configured to, in response to determining that the ground current of the adjacent terminal box is greater than or equal to a first current alarm value, set a ground current alarm value of the terminal box to a first value; and in response to determining that the ground current of the adjacent terminal box is greater than or equal to a second current alarm value, set the ground current alarm value of the terminal box to a second value.

The cable ground wire overcurrent alarm unit is configured to, in response to determining that the summation of currents of the ground wires in the armouring layer or the summation of currents of the ground wires in the shielding layer is greater than or equal to the corresponding overcurrent alarm value, call the alarm module to perform an armouring layer ground wire overcurrent alarm or a shielding layer ground wire overcurrent alarm; where the summation of currents of the ground wires in the armouring layer corresponds to an armouring layer overcurrent alarm value, and the summation of currents of the ground wires in the shielding layer corresponds to a shielding layer overcurrent alarm value.

The alarm module is configured to, after a criterion for the potential difference alarm is met, send a terminal box potential difference alarm signal after a setting delay; after a criterion for the shielding layer ground wire overcurrent alarm is met, send a cable shielding layer overcurrent alarm signal after a setting delay; after a criterion for the armouring layer ground wire overcurrent alarm is met, send a cable armouring layer overcurrent alarm signal after a setting delay; after a criterion for the terminal box cable loop loop-current alarm is met, send a terminal box cable loop loop-current alarm signal after a setting delay; in response to determining that the ground current of the adjacent terminal box is greater than or equal to the first current alarm value, send a terminal box ground current alarm signal after a setting delay; and in response to determining that the ground current of the adjacent terminal box is greater than or equal to the second current alarm value, send an adjacent terminal box ground current alarm signal after a setting delay.

DETAILED DESCRIPTION

A large number of maintenance data show that the fire accident on the cable near the dry reactor generally satisfies the following two conditions: 1) the heating cable is located near the dry-type reactor, that is, in a strong electromagnetic environment; and 2) a loop (for example, when the insulation between the armouring layer and the shielding layer is worn through or when the armouring layer ground wire or the shielding layer ground wire is shorted out) occurs due to a certain problem (for example, poor cable installation process). In some other cable fire accidents, there is a third condition, that is, a potential difference exists between the primary ground and the secondary ground. Conditions 1 and 2 are generally necessary conditions for heating and burning, and when Condition 3 is also met, multiple cables may be heated at the same time, causing more complicated heating situations. Such heating situations, if not found in time, may cause the ground wire of the cable to be heated or even burn the cable.

Figure 1:
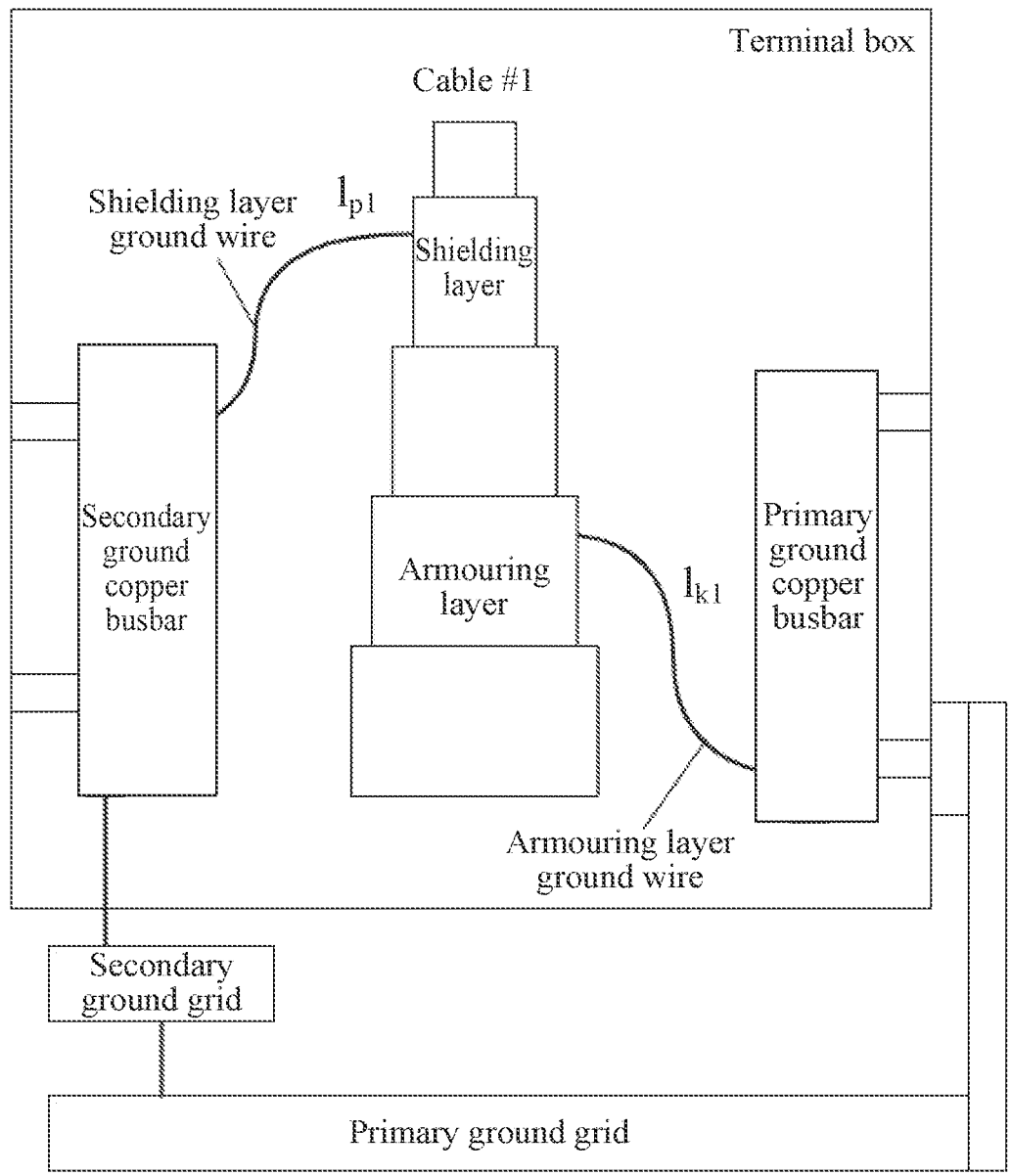
FIG. 1 is a schematic diagram of the grounding of an armouring shielding cable provided by an embodiment of the present application.

Substations adopt a large number of armouring shielding cables. As shown in FIG. 1, the cable #1 in the terminal box includes a shielding layer and an armouring layer. The shielding layer is usually grounded at two terminals, that is, both terminals of the shielding layer are connected to a secondary ground grid through a shielding layer ground wire, a secondary ground copper busbar, and a ground copper cable. The armouring layer is grounded currently in different manners, and the mainstream manner is that both terminals of the armouring layer are connected to a primary ground grid through an armouring layer ground wire and a primary ground copper busbar.

The non-limiting embodiments will be described based on a double-ground armouring shielding cable. If the armouring layer with one-terminal grounding is used for description, the possibility that some cable ground wires form loops is reduced on the basis of sacrificing a certain anti-interference effect. For details, reference may also be made to the monitoring scheme deployed by the embodiments of the present application.

In a strong electromagnetic environment, the factors that cause the fire risks of the armouring shielding cable include a potential difference, a loop current, and a ground current, and thus, a potential difference alarm, a cable loop-current alarm, and a ground current alarm will be described in detail in the embodiments of the present application.

Figure 2:
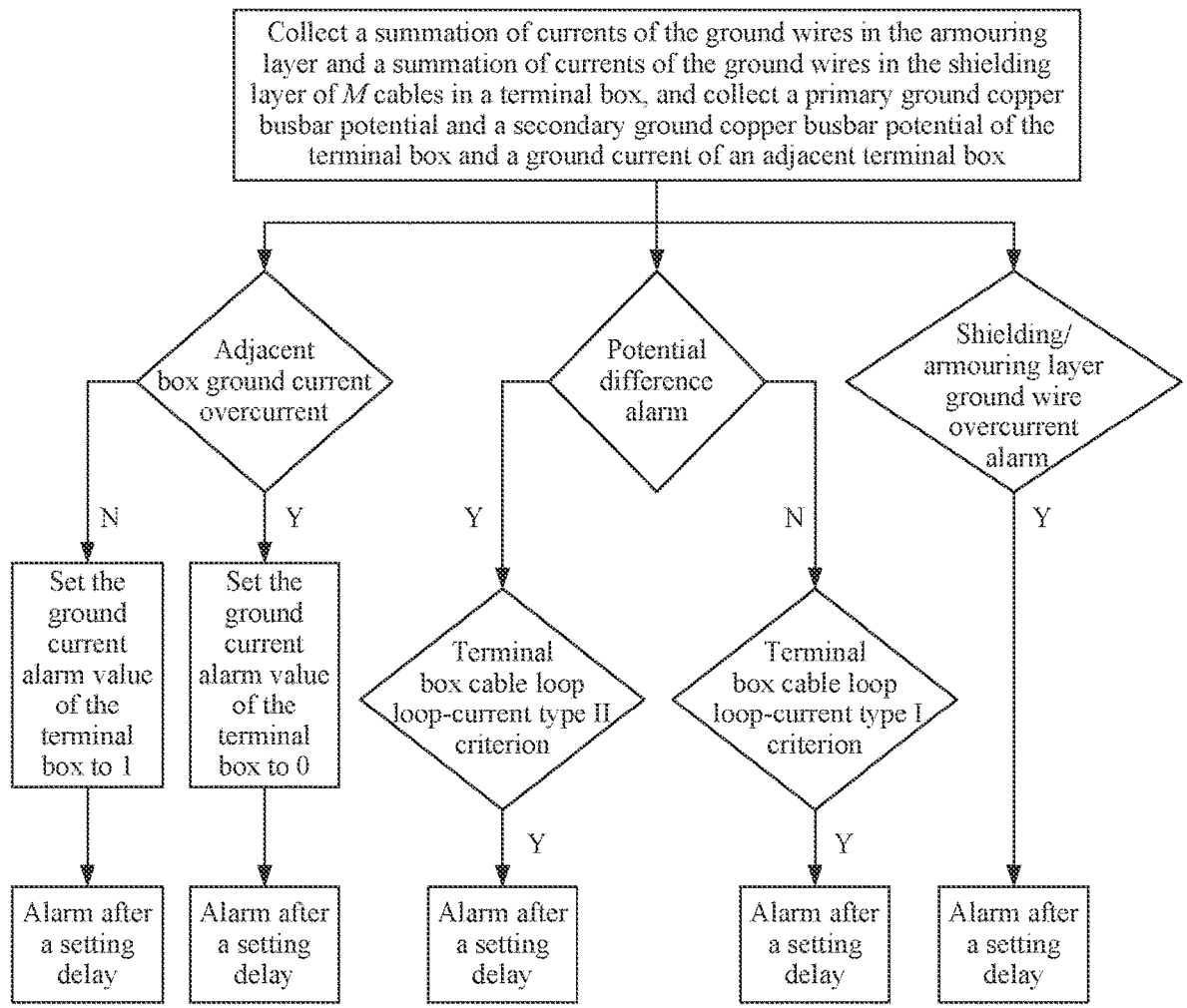
FIG. 2 is a flowchart of a method for monitoring a current of the ground wire of an armouring shielding cable in a strong electromagnetic environment provided by an embodiment of the present application.

According to the above analysis, the embodiments of the present application provide a method for monitoring a current of the ground wire of an armouring shielding cable in a strong electromagnetic environment. As shown in FIG. 2, the currents of the ground wires of M armouring shielding cables in a terminal box are monitored, and the method includes the following steps.

In step 1, a summation of currents of the ground wires in the armouring layer and a summation of currents of the ground wires in the shielding layer of M cables in a terminal box are collected, and a primary ground copper busbar potential and a secondary ground copper busbar potential of the terminal box and a ground current of an adjacent terminal box are collected.

For example, the current of the ground wire in the shielding layer of the cable #1 in a switching station terminal box is denoted as $I_{p1}$, and the current of the ground wire in the armouring layer is denoted as $I_{k1}$. When M armouring shielding cables exist in the terminal box, the currents of the ground wires in the shielding layer of the cables are $I_{p1}$, $I_{p2}$, ..., and $I_{pM}$, respectively, and the currents of the ground wires in the armouring layer of the cables are $I_{k1}$, $I_{k2}$, ..., and $I_{kM}$, respectively; the summation of currents $I_P$ of the ground wires in the shielding layer and the summation of currents $I_K$ of the ground wires in the armouring layer of M cables satisfy the following relationships:

$$I_P = \sum_{i=1}^{M} I_{pi};$$
$$I_K = \sum_{i=1}^{M} I_{ki}.$$

In the above relationships, $I_P$ denotes the summation of currents of the ground wires in the shielding layer, and $I_K$ denotes the summation of currents of the ground wires in the armouring layer.

Considering serious electric leakage occurs in a number of different cables in the same terminal box at the same time and the ground wires of the armouring layer of the cables are in different loops, the probability of phase cancellation of the ground wire currents in the armouring layer is relatively small. Therefore, for economic considerations, the collection of the summation of currents of the ground wires in the armouring layer is adopted here. Similarly, the collection of the summation of currents of the ground wires in the shielding layer is also adopted here.

The nearest connection point to the terminal box among the connection points between a secondary ground copper busbar of the terminal box and a secondary ground grid is configured as a potential reference point; according to the potential reference point, a potential of a connection point between a box ground terminal of the terminal box and a primary ground copper busbar is measured as the primary ground copper busbar potential, a potential of the secondary ground copper busbar is measured as the secondary ground copper busbar potential, and a current flowing into the primary ground copper busbar from a box ground terminal of the adjacent terminal box is measured as the ground current of the adjacent terminal box.

In practical engineering, since a potential difference exists on the primary ground copper busbar, the potential of a starting point which is the closest to the box of the terminal box is taken as the primary ground copper busbar potential, thereby accurately reflecting the potential difference state of the terminal box. In a non-limiting embodiment, the potential of a connection point between the box ground terminal of the terminal box and the primary ground copper busbar is taken as the primary ground copper busbar potential.

For example, the sampling interval is 1 ms for one data point.

In step 2, a potential difference is acquired using the collected potentials, and when the potential difference is greater than or equal to a potential difference alarm value, a potential difference alarm is performed; when the potential difference is not alarmed, if the summation of currents of the ground wires in the armouring layer and the summation of currents of the ground wires in the shielding layer both are not less than corresponding overcurrent alarm values respectively and the sum of the summation of currents of the ground wires in the armouring layer and the summation of currents of the ground wires in the shielding layer is not greater than a loop current alarm value, a terminal box cable loop loop-current alarm is performed; when the potential difference is alarmed, the overcurrent alarm values and the loop current alarm value are corrected, and if the summation of currents of the ground wires in the armouring layer and the summation of currents of the ground wires in the shielding layer both are not less than the corresponding corrected overcurrent alarm values respectively and the sum of the summation of currents of the ground wires in the armouring layer and the summation of currents of the ground wires in the shielding layer is not greater than or equal to the corrected loop current alarm value, a terminal box cable loop loop-current alarm is performed.

When the ground current of the adjacent terminal box is not less than a first current alarm value, a ground current alarm value of the terminal box is set to a first value (e.g. high value); when the ground current of the adjacent terminal box is not less than a second current alarm value and a ground current increment of the adjacent terminal box is not less than a current increment alarm value, the ground current alarm value of the terminal box is set to a second value (e.g. low value); when a ground current of the terminal box is greater than the ground current alarm value, a terminal box ground current alarm is performed; where the first current alarm value is greater than the second current alarm value.

The influence of the ground current of the adjacent box on the fire risk of the current box is integrated into the criterion by setting the ground current alarm value of the terminal box, and the influence of the ground current of the adjacent terminal box on the current terminal box is fully reflected through the setting of a high value and a low value, because when the ground current of the adjacent terminal box is relatively large (not less than the first current alarm value), whether to alarm needs to be determined only based on the ground current of the terminal box, and the alarm is configured as not being easily performed; when the ground current of the adjacent terminal box is relatively small, whether to alarm needs to be determined according to the ground current of the terminal box and the ground current increment, and the alarm is configured as being easily performed.

If the summation of currents of the ground wires in the armouring layer or the summation of currents of the ground wires in the shielding layer is not less than the corresponding overcurrent alarm value, an armouring layer ground wire overcurrent alarm or a shielding layer ground wire overcurrent alarm is performed.

The summation of currents of the ground wires in the armouring layer corresponds to an armouring layer overcurrent alarm value, and the summation of currents of the ground wires in the shielding layer corresponds to a shielding layer overcurrent alarm value.

For example, a terminal box leakage alarm includes five criteria, as follows:

1) potential difference alarm criterion is as follows:

$$|U_I - U_{II}| \geq U_{T1}.$$

In the above relationship, $U_I$ denotes the primary ground copper busbar potential of the terminal box.

$U_{II}$ denotes the secondary ground copper busbar potential of the terminal box.

$U_{T1}$ denotes a ground potential difference alarm value of the terminal box between the primary ground copper busbar potential and the secondary ground copper busbar potential of the terminal box, and the experience value of $U_{T1}$ is set to 1 V.

After the criterion for the potential difference alarm is met, a signal "potential difference alarm near the XX terminal box" is sent after a setting delay $t_3$ (generally 30 seconds).

2) box ground current overcurrent criterion

In practical engineering, the adjacent terminal box and the monitored terminal box are adjacent to each other in the sense of the ground grid and are generally terminal boxes within the interval between adjacent devices.

When the ground current of the adjacent terminal box satisfies the following relationship, no "box ground current overcurrent alarm" occurs in the adjacent terminal box, and the ground current alarm value of the terminal box is set to 1: $I_J \geq k_1 I_{T1}$.

When the ground current of the adjacent terminal box satisfies the following relationship, the "box ground current overcurrent alarm" occurs in the adjacent terminal box, and the ground current alarm value of the terminal box is set to 0: $I_J \geq k_2 I_{T1}$ and $\Delta I_J \geq I_{T2}$.

In the criterion for the box ground current overcurrent provided by the embodiments of the present application, when no overcurrent alarm occurs in the ground current of the adjacent terminal box, the alarm of the current monitored terminal box adopts a high value, that is, the alarm is not easily performed, and when an overcurrent alarm occurs in the ground current of the adjacent terminal box, the alarm of the current monitored terminal box adopts a low value, that is, the alarm is easily performed.

In the above relationships, $I_J$ denotes the ground current of the adjacent terminal box, and $\Delta I_J$ denotes the ground current increment of the adjacent terminal box.

$I_{T1}$ denotes an alarm value when a ground current overcurrent of the adjacent terminal box exceeds a limit, and the experience value of $I_{T1}$ is set to 15 A; and $I_{T2}$ denotes an alarm value of the ground current increment of the adjacent terminal box, and the experience value of $I_{T2}$ is set to 5 A.

$k_1$ and $k_2$ are a first coefficient and a second coefficient, respectively, where $k_2 \in [1, k_1]$, and $k_1$ is a real number greater than 1. In a non-limiting embodiment, $k_1$ is a real number greater than 1, for example, 2, and $k_2 \in [1, k_1]$, for example, 1.5.

$k_1 I_{T1}$ denotes the first current alarm value.

$k_2 I_{T1}$ denotes the second current alarm value.

When no "box ground current overcurrent alarm" occurs at a nearby terminal box, after the criterion for the box ground current overcurrent is met, a signal "current box ground current overcurrent alarm" is sent after a setting delay $t_1$ (whose experience value is generally set to 30 seconds).

When a "box ground current overcurrent alarm" occurs at a nearby terminal box, after the criterion for the box ground current overcurrent is met, a signal "box ground current overcurrent alarm of the XX terminal box" is sent after a setting delay $t_2$ (whose experience value is set to 15 seconds).

3) shielding layer ground wire overcurrent criterion is as follows:

$$I_P \geq k_P I_{T3}.$$

In the above relationship, $I_{T3}$ denotes the shielding layer ground wire alarm value, and $k_P$ denotes a shielding layer ground wire current coefficient and $k_P$ a real number greater than 1.

After the criterion for the shielding layer ground wire overcurrent is met, a signal "cable shielding layer overcurrent alarm" is sent after a setting delay $t_4$ (generally 15 seconds).

4) ground wire overcurrent criterion is as follows:

$$I_K \geq k_K I_{T4}.$$

In the above relationship, $I_{T4}$ denotes the armouring layer ground wire alarm value, and $k_K$ denotes an armouring layer ground wire current coefficient that is a real number greater than 1.

After the criterion for the armouring layer ground wire overcurrent is met, a signal "cable armouring layer overcurrent alarm" is sent after a setting delay $t_4$ (generally 15 seconds).

5) terminal box cable loop loop-current criterion

In a strong electromagnetic environment, for example, when the cable ground wires within the box form loops for a certain reason, the cables are easily heated, causing a fire. According to the on-site emergency maintenance practice, the sum of the summation of currents of the ground wires in the armouring layer and the summation of currents of the ground wires in the shielding layer or the high overcurrent of one of the armouring layer ground wire or the shielding layer ground wire is not the root cause of the formation of the loop current, so the criterion provided by the embodiments of the present application is that "the sum of the summation of currents of the ground wires in the armouring layer and the summation of currents of the ground wires in the shielding layer is not greater than a loop current alarm value".

The terminal box cable loop loop-current criterion is as follows:

5.1) when the potential difference alarm criterion is not met

The loop formed due to cable insulation damage generally generates a current in a strong electromagnetic environment, and when the case where insulation damage occurs in multiple cables at the same time is not considered, there are $$\begin{cases} I_P \geq k_P I_{T3} \\ I_K \geq k_K I_{T4} \\ |I_P + I_K| \leq I_{T5} \end{cases}$$

In the above relationships, $I_K$ denotes the summation of currents of the ground wires in the armouring layer, $I_P$ denotes the summation of currents of the ground wires in the shielding layer, $I_{T3}$ denotes the shielding layer ground wire alarm value, $I_{T4}$ denotes the armouring layer ground wire alarm value, $I_{T5}$ denotes the loop current alarm value, $k_P$ denotes the shielding layer ground wire current coefficient and $k_P$ is a real number greater than 1, and $k_K$ is the armouring layer ground wire current coefficient and $k_K$ is a real number greater than 1.

$I_{T5}$ is used for determining whether a certain armouring layer ground wire or several armouring layer ground wires and the shielding layer ground wires within the terminal box are in the same loop, and the value of $I_{T5}$ is generally set to be less than 5 A.

5.2) when the potential difference alarm criterion is met

When the potential difference is alarmed, problems may occur in the ground grid. According to practical experience, the possibility that insulation damage occurs in multiple cables at the same time or around the same time needs to be considered. At this point, due to the effect of the phase cancellation of part of the current, the alarm value thresholds of $I_P$ and $I_K$ should be reduced. In addition, considering that electric leakage occurs in multiple cables at the same time, more unbalanced currents should be considered. Therefore, the constraint of $|I_P+I_K|$ needs to be relaxed:

$$\begin{cases} |U_I - U_{II}| \geq U_{T1} \\ I_P \geq k_U k_P I_{T3} \\ I_K \geq k_U k_K I_{T4} \\ |I_P + I_K| \leq \dfrac{1}{k_U} I_{T5} \end{cases}.$$

In the above relationships, $k_U$ denotes a coefficient of influence of a potential difference on an alarm value, and the experience value of $k_U$ is set to 0.5.

After the criterion for the terminal box cable loop loop-current is met, a signal "terminal box cable loop loop-current alarm" is sent after a setting delay $t_5$ (generally 15 seconds).

Since there are many causes of fire, the criteria are also different, each criterion is independent of each other, and the determination results can thus be obtained quickly. The point of invention that the inventors claim to protect is the innovation of the criteria, for example, the criterion of being not greater than of the loop current, the combined criterion of potential difference+loop current, and the setting of the ground alarm value of the adjacent terminal box to the current terminal box, all of which are based on the on-site maintenance experience.

The monitoring of a current of the ground wire of an armouring shielding cable in a strong electromagnetic environment provided by the embodiments of the present application has wide coverage, and the criteria provided here are found in on-site repair and emergency maintenance and are accurate and effective for the monitoring of a ground wire cable of an armouring shielding cable in a strong electromagnetic environment such as the dry reactor site.

In the embodiments of the present application, a potential difference alarm criterion, a box ground current overcurrent criterion, a shielding layer ground wire overcurrent criterion, an armouring layer ground wire overcurrent criterion, and a terminal box cable loop loop-current criterion are established through the terminal box ground current feature analysis and the on-site data collection. In the box ground current overcurrent criterion, the influence of the ground overcurrent of the adjacent terminal box on the current terminal box is fully considered, and different alarm values are set, thereby ensuring the reliability and accuracy of the alarm in different ground current environments. In the terminal box cable loop loop-current criterion, the potential difference alarm is introduced to improve the criterion logic to cope with the real situation of the occurrence of loops caused by insulation damage of the cable loop, thereby avoiding false alarms and missed alarms.

The influence of the ground current of the adjacent box on the fire risk of the current box is integrated into the criterion by setting the ground current alarm value of the terminal box, and the influence of the ground current of the adjacent terminal box on the current terminal box is fully reflected through the setting of a high value and a low value, because when the ground current of the adjacent terminal box is relatively large (not less than the first current alarm value), whether to alarm needs to be determined only based on the ground current of the terminal box, and the alarm is configured as not being easily performed; when the ground current of the adjacent terminal box is relatively small, whether to alarm needs to be determined according to the ground current of the terminal box and the ground current increment, and the alarm is configured as being easily performed.

The method for collecting currents and voltages in the embodiments of the present application is easy to perform in engineering practice and does not affect the operation and construction of existing equipment.

The embodiments of the present application further provide an apparatus for monitoring a current of the ground wire of an armouring shielding cable in a strong electromagnetic environment. The apparatus includes a collection module, a monitoring module, and an alarm module.

The collection module is configured to collect a summation of currents of the ground wires in the armouring layer and a summation of currents of the ground wires in the shielding layer of M cables in a terminal box and collect a primary ground copper busbar potential and a secondary ground copper busbar potential of the terminal box and a ground current of an adjacent terminal box.

The monitoring module includes a potential difference alarm unit, a terminal box ground current alarm unit, a cable ground wire overcurrent alarm unit, and a cable loop loop-current alarm unit.

The potential difference alarm unit is configured to acquire a potential difference using the collected potentials, and when the potential difference is not less than a potential difference alarm value, call the alarm module to perform a potential difference alarm.

The cable loop loop-current alarm unit is configured to, when the potential difference is not alarmed, if the summation of currents of the ground wires in the armouring layer and the summation of currents of the ground wires in the shielding layer are not less than corresponding overcurrent alarm values respectively and the sum of the summation of currents of the ground wires in the armouring layer and the summation of currents of the ground wires in the shielding layer is not greater than a loop current alarm value, call the alarm module to perform a terminal box cable loop loop-current alarm; when the potential difference is alarmed, correct the overcurrent alarm values and the loop current alarm value, and if the summation of currents of the ground wires in the armouring layer and the summation of currents of the ground wires in the shielding layer are not less than the corrected overcurrent alarm values respectively and the sum of the summation of currents of the ground wires in the armouring layer and the summation of currents of the ground wires in the shielding layer is not greater than the corrected loop current alarm value, call the alarm module to perform a terminal box cable loop loop-current alarm.

The terminal box ground current alarm unit is configured to, when the ground current of the adjacent terminal box is not less than a first current alarm value, set a ground current alarm value of the terminal box to a first value; and when the ground current of the adjacent terminal box is not less than a second current alarm value, set the ground current alarm value of the terminal box to a second value.

The cable ground wire overcurrent alarm unit is configured to, when the summation of currents of the ground wires in the armouring layer or the summation of currents of the ground wires in the shielding layer is not less than the corresponding overcurrent alarm value, call the alarm module to perform a armouring layer ground wire overcurrent alarm or a shielding layer ground wire overcurrent alarm; where the summation of currents of the ground wires in the armouring layer corresponds to an armouring layer overcurrent alarm value, and the summation of currents of the ground wires in the shielding layer corresponds to a shielding layer overcurrent alarm value.

The alarm module is configured to, after a criterion for the potential difference alarm is met, send a terminal box potential difference alarm signal after a setting delay; after a criterion for the shielding layer ground wire overcurrent alarm is met, send a cable shielding layer overcurrent alarm signal after a setting delay; after a criterion for the armouring layer ground wire overcurrent alarm is met, send a cable armouring layer overcurrent alarm signal after a setting delay; after a criterion for the terminal box cable loop loop-current alarm is met, send a terminal box cable loop loop-current alarm signal after a setting delay; when the ground current of the adjacent terminal box is not less than the first current alarm value, send a terminal box ground current alarm signal after a setting delay; and when the ground current of the adjacent terminal box is not less than the second current alarm value, send an adjacent terminal box ground current alarm signal after a setting delay.

The embodiments of the present application provide a method and apparatus for monitoring a current of the ground wire of an armouring shielding cable in a strong electromagnetic environment, and on the basis of the terminal box ground current feature analysis and the on-site data collection, a complete set of methods for monitoring the current of the ground wire of the cable in the terminal box is provided, thereby avoiding the problems that the mechanism of the heating and burning of the terminal box in a strong magnetic environment is unknown in early times and there are no proper monitoring means and comprehensively improving the monitoring level of cables in the substation terminal box.

Figure 3:
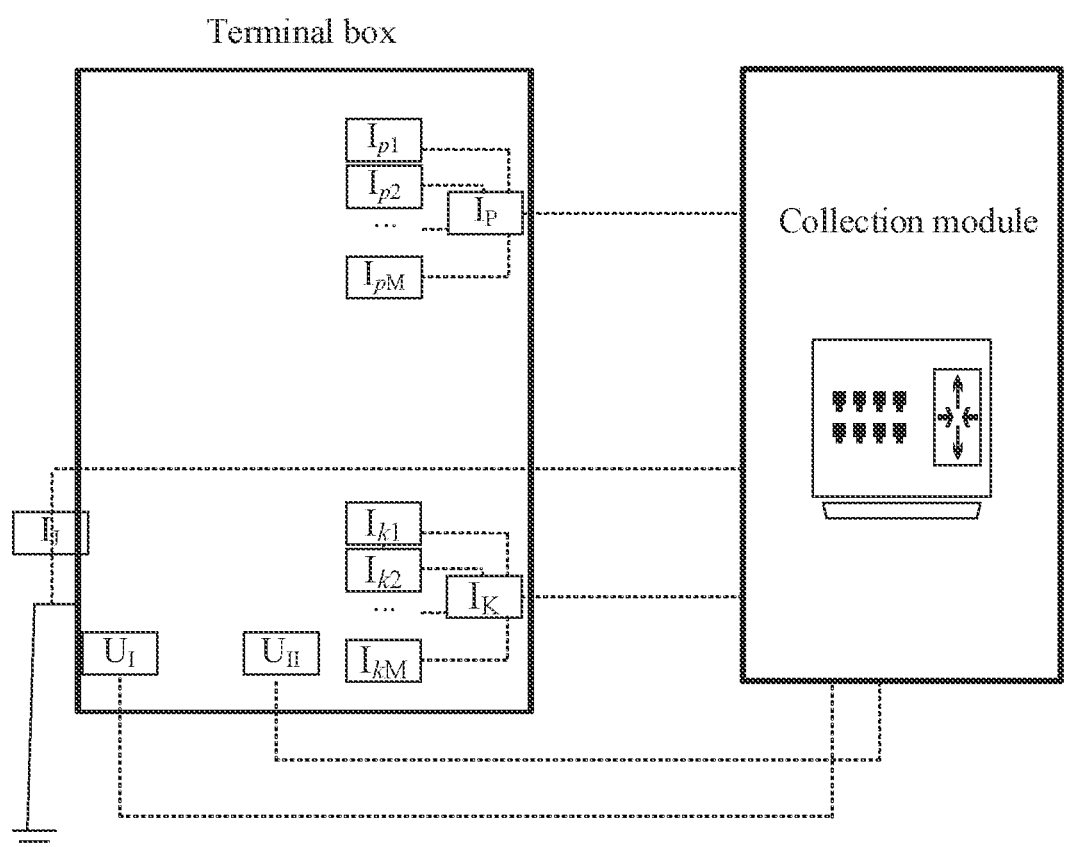
FIG. 3 is a schematic diagram of an apparatus for monitoring a current of the ground wire of an armouring shielding cable in a strong electromagnetic environment provided by an embodiment of the present application.

As shown in FIG. 3, the apparatus for monitoring a current of the ground wire of an armouring shielding cable in a strong electromagnetic environment is configured with a collection module for collecting parameters required by five criteria of the terminal box leakage alarm.

The method provided by the embodiments of the present application can also be used for monitoring a current of the ground wire of an armouring shielding cable in a conventional electromagnetic environment.

The present disclosure may be a system, a method and/or a computer program product. The computer program product may include a computer-readable storage medium having computer-readable program instructions thereon for causing a processor to carry out aspects of the present disclosure.

The computer-readable storage medium can be a tangible device that can retain and store instructions for use by an instruction execution device. A computer-readable storage medium may be, for example, but not limited to, an electronic storage device, a magnetic storage device, an optical storage device, an electromagnetic storage device, a semiconductor storage device, or any suitable combination of the foregoing. A non-exhaustive list of examples of the computer-readable storage medium includes: a portable computer diskette, a hard disk, a random-access memory (RAM), a read-only memory (ROM), an erasable programmable read-only memory (EPROM or Flash memory), a static random-access memory (SRAM), a portable compact disc read-only memory (CD-ROM), a digital versatile disc (DVD), a memory stick, a floppy disk, a mechanically encoded device such as punch-cards or raised structures in a groove having instructions recorded thereon, and any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer-readable program instructions described herein can be downloaded to respective computing/processing devices from a computer-readable storage medium or to an external computer or external storage device via a network, for example, the Internet, a local area network, a wide area network and/or a wireless network. The network may include copper transmission cables, optical transmission fibers, wireless transmission, routers, switches, gateway computers and/or edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations of the present disclosure may be assembler instructions, industry standard architecture (ISA) instructions, machine instructions, machine dependent instructions, microcode, firmware instructions, state-setting data, or either source code or object code written in any combination of one or more programming languages, including an object-oriented programming language such as Smalltalk, C++ or the like, and conventional procedural programming languages "C" programming language or similar programming languages. The computer-readable program instructions may be executed entirely on a user computer, executed partly on a user computer, executed as a stand-alone software package, executed partly on a user computer and partly on a remote computer, or executed entirely on a remote computer or a server. In the latter scenario, the remote computer may be connected to the user computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry, in order to perform aspects of the present disclosure.

Finally, it is to be noted that the embodiments described above are used to describe the embodiments of the present application and are not intended to limit the embodiments of the present application. Although the present application has been described with reference to the above-mentioned embodiments, it should be understood by those of ordinary skill in the art that the specific embodiments of the present application may still be modified or equivalently substituted and such modifications or substitutions all fall within the scope of the claims of the present disclosure.

What is claimed is:

1. A method for monitoring a current of a ground wire of an armouring shielding cable in a strong electromagnetic environment to monitor currents of ground wires of M armouring shielding cables in a terminal box, comprising:
    collecting a summation of currents of ground wires in an armouring layer and a summation of currents of ground wires in a shielding layer of the M cables in the terminal box, and collecting a primary ground copper busbar potential and a secondary ground copper busbar potential of the terminal box and a ground current of an adjacent terminal box;
    using an absolute value of a difference value between the collected primary ground copper busbar potential and the collected secondary ground copper busbar potential as a potential difference, and in response to determining that the potential difference is greater than or equal to a potential difference alarm value, performing a potential difference alarm;
    when the potential difference is not alarmed, in response to determining that the summation of currents of the armouring layer and the summation of currents of the shielding layer are greater than or equal to corresponding overcurrent alarm values, respectively, and that a sum of the summation of currents of the armouring layer and the summation of currents of the shielding layer is less than or equal to a loop current alarm value, performing a terminal box cable loop loop-current alarm;
    when the potential difference is alarmed, correcting the overcurrent alarm values and the loop current alarm value, and in response to determining that the summation of currents of the armouring layer and the summation of currents of the shielding layer are greater than or equal to corrected overcurrent alarm values, respectively, and that a sum of the summation of currents of the armouring layer and the summation of currents of the shielding layer is less than or equal to a corrected loop current alarm value, performing a terminal box cable loop loop-current alarm;
    in response to determining that the ground current of the adjacent terminal box is greater than or equal to a first current alarm value, setting a ground current alarm value of the terminal box to a high value;
    in response to determining that the ground current of the adjacent terminal box is greater than or equal to a second current alarm value and a ground current increment of the adjacent terminal box is greater than or equal to a current increment alarm value, setting the ground current alarm value of the terminal box to a value; and
    in response to determining that a ground current of the terminal box is greater than the ground current alarm value, performing a terminal box ground current alarm, wherein the first current alarm value is greater than the second current alarm value.

2. The method for monitoring the current of the ground wire of the armouring shielding cable in the strong electromagnetic environment according to claim 1, further comprising: in response to determining that the summation of currents of the armouring layer or the summation of currents of the shielding layer is greater than or equal to the corresponding overcurrent alarm value, performing an armouring layer ground wire overcurrent alarm or a shielding layer ground wire overcurrent alarm;
    wherein the summation of currents of the ground wires in the armouring layer corresponds to an armouring layer overcurrent alarm value, and the summation of currents of the ground wires in the shielding layer corresponds to a shielding layer overcurrent alarm value.

3. The method for monitoring a the current of the ground wire of the armouring shielding cable in the strong electromagnetic environment according to claim 2, wherein
    the summation of currents $I_P$ of the ground wires in the shielding layer and the summation of currents $I_K$ of the ground wires in the armouring layer of the M cables satisfy the following relationships:

$$I_P = \sum_{i=1}^{M} I_{pi};$$

$$I_K = \sum_{i=1}^{M} I_{ki};$$

wherein in the relationships,
$I_{p1}, I_{p2}, \ldots,$ and $I_{pM}$ denote the currents of the ground wires in the shielding layer of the M cables; and
$I_{k1}, I_{k2}, \ldots,$ and $I_{kM}$ denote the currents of the ground wires in the armouring layer of the M cables.

4. The method for monitoring the current of the ground wire of the armouring shielding cable in the strong electromagnetic environment according to claim 3, wherein
    a criterion for the shielding layer ground wire overcurrent alarm is as follows:

$$I_P \geq k_P I_{T3};$$

a criterion for the armouring layer ground wire overcurrent alarm is as follows:

$$I_K \geq k_K I_{T4};$$

wherein in the relationships,
$I_{T3}$ denotes a shielding layer ground wire alarm value;
$I_{T4}$ denotes an armouring layer ground wire alarm value;
$k_P$ denotes a shielding layer ground wire current coefficient and $k_P$ is a real number greater than 1; and
$k_K$ denotes an armouring layer ground wire current coefficient and $k_K$ is a real number greater than 1.

5. The method for monitoring the current of the ground wire of the armouring shielding cable in the strong electromagnetic environment according to claim 4, further comprising:
after the criterion for the shielding layer ground wire overcurrent alarm is met, sending a cable shielding layer overcurrent alarm signal after a setting delay; and
after the criterion for the armouring layer ground wire overcurrent alarm is met, sending a cable armouring layer overcurrent alarm signal after the setting delay.

6. The method for monitoring a current of the ground wire of the armouring shielding cable in the strong electromagnetic environment according to claim 1, further comprising:
configuring a nearest connection point to the terminal box among connection points between the secondary ground copper busbar of the terminal box and the secondary ground grid as a potential reference point; and
according to the potential reference point, measuring a potential of a connection point between a box ground terminal of the terminal box and a primary ground copper busbar as the primary ground copper busbar potential, measuring a potential of the secondary ground copper busbar as the secondary ground copper busbar potential, and measuring a current flowing into the primary ground copper busbar from a box ground terminal of the adjacent terminal box as the ground current of the adjacent terminal box.

7. The method for monitoring the current of the ground wire of the armouring shielding cable in the strong electromagnetic environment according to claim 6, further comprising:
after the criterion for the potential difference alarm is met, sending a terminal box potential difference alarm signal after a setting delay.

8. The method for monitoring the current of the ground wire of the armouring shielding cable in the strong electromagnetic environment according to claim 6, further comprising:
when the potential difference is not alarmed and the summation of currents of the ground wires in the armouring layer and the summation of currents of the ground wires in the shielding layer satisfy the following relationships, performing the terminal box cable loop loop-current alarm:

$$\begin{cases} I_P \geq k_P I_{T3} \\ I_K \geq k_K I_{T4} \\ |I_P + I_K| \leq I_{T5} \end{cases} ;$$

wherein in the relationships,
$I_K$ denotes the summation of currents of the ground wires in the armouring layer;
$I_P$ denotes the summation of currents of the ground wires in the shielding layer;
$I_{T3}$ denotes a shielding layer ground wire alarm value;
$I_{T4}$ denotes an armouring layer ground wire alarm value;
$I_{T5}$ denotes a loop current alarm value;
$k_P$ denotes a shielding layer ground wire current coefficient and $k_P$ is a real number greater than 1; and
$k_K$ denotes an armouring layer ground wire current coefficient and $k_K$ is a real number greater than 1.

9. The method for monitoring the current of the ground wire of the armouring shielding cable in the strong electromagnetic environment according to claim 8, further comprising:
when the potential difference is alarmed and the summation of currents of the ground wires in the armouring layer and the summation of currents of the ground wires in the shielding layer satisfy the following relationships, performing the terminal box cable loop loop-current alarm:

$$\begin{cases} |U_I - U_{II}| \geq U_{T1} \\ I_P \geq k_U k_P I_{T3} \\ I_K \geq k_U k_K I_{T4} \\ |I_P + I_K| \leq \dfrac{1}{k_U} I_{T5} \end{cases} ;$$

wherein in the relationships, $k_U$ is a coefficient of influence of a potential difference on an alarm value.

10. The method for monitoring the current of the ground wire of the armouring shielding cable in the strong electromagnetic environment according to claim 8, further comprising:
after a criterion for the terminal box cable loop loop-current alarm is met, sending a terminal box cable loop loop-current alarm signal after a setting delay.

11. The method for monitoring the current of the ground wire of the armouring shielding cable in the strong electromagnetic environment according to claim 1, wherein
the ground current alarm value of the terminal box is set to 1 when the ground current of the adjacent terminal box satisfies the following relationship:

$$I_J \geq k_1 I_{T1};$$

the ground current alarm value of the terminal box is set to 0 when the ground current of the adjacent terminal box satisfies the following relationship:

$$I_J \geq k_2 I_{T1} \text{ and } \Delta I_J \geq I_{T2};$$

wherein in the relationships,
$I_J$ denotes the ground current of the adjacent terminal box;
$\Delta I_J$ denotes the ground current increment of the adjacent terminal box;
$k_1$ and $k_2$ denote a first coefficient and a second coefficient, respectively, wherein $k_2 \in [1, k_1]$, and $k_1$ is a real number greater than 1;
$I_{T1}$ denotes an alarm value when a ground current overcurrent of the adjacent terminal box exceeds a limit;
$k_1 I_{T1}$ denotes the first current alarm value;
$k_2 I_{T1}$ denotes the second current alarm value; and
$I_{T2}$ denotes a ground current increment alarm value of the adjacent terminal box.

12. The method for monitoring the current of the ground wire of the armouring shielding cable in the strong electromagnetic environment according to claim 11, further comprising:
in response to determining that the ground current of the adjacent terminal box is greater than or equal to the first current alarm value, sending a terminal box ground current alarm signal after a setting delay; and
in response to determining that the ground current of the adjacent terminal box is greater than or equal to the second current alarm value, sending an adjacent terminal box ground current alarm signal after the setting delay.

13. An apparatus for monitoring a current of the ground wire of an armouring shielding cable in a strong electromagnetic environment to implement the method according to claim 1, comprising a collection module, a monitoring module, and an alarm module; wherein the collection module is configured to collect a summation of currents of ground wires in the armouring layer and a summation of currents of ground wires in the shielding layer of M cables in a terminal box and collect a primary ground copper busbar potential and a secondary ground copper busbar potential of the terminal box and a ground current of an adjacent terminal box;

the monitoring module comprises a potential difference alarm unit, a terminal box ground current alarm unit, a cable ground wire overcurrent alarm unit, and a cable loop loop-current alarm unit; wherein the potential difference alarm unit is configured to use an absolute value of a difference value between the collected primary ground copper busbar potential and the collected secondary ground copper busbar potential as a potential difference, and in response to determining that the potential difference is greater than or equal to a potential difference alarm value, call the alarm module to perform a potential difference alarm;

the cable loop loop-current alarm unit is configured to, when the potential difference is not alarmed, in response to determining that the summation of currents of the armouring layer and the summation of currents of the shielding layer are greater than or equal to corresponding overcurrent alarm values, respectively, and that a sum of the summation of currents of the armouring layer and the summation of currents of the shielding layer is less than or equal to a loop current alarm value, call the alarm module to perform a terminal box cable loop loop-current alarm; when the potential difference is alarmed, correct the overcurrent alarm values and the loop current alarm value, and in response to determining that the summation of currents of the armouring layer and the summation of currents of the shielding layer are greater than or equal to corrected overcurrent alarm values, respectively, and that a sum of the summation of currents of the armouring layer and the summation of currents of the shielding layer is less than or equal to a corrected loop current alarm value, call the alarm module to perform a terminal box cable loop loop-current alarm;

the terminal box ground current alarm unit is configured to, in response to determining that the ground current of the adjacent terminal box is greater than or equal to a first current alarm value, set a ground current alarm value of the terminal box to a high value; and in response to determining that the ground current of the adjacent terminal box is greater than or equal to a second current alarm value, set the ground current alarm value of the terminal box to a low value; and the cable ground wire overcurrent alarm unit is configured to, in response to determining that the summation of currents of the armouring layer or the summation of currents of the shielding layer is greater than or equal to the corresponding overcurrent alarm value, call the alarm module to perform a armouring layer ground wire overcurrent alarm or a shielding layer ground wire overcurrent alarm; wherein the summation of currents of the armouring layer corresponds to an armouring layer overcurrent alarm value, and the summation of currents of the shielding layer corresponds to a shielding layer overcurrent alarm value;

the alarm module is configured to, after a criterion for the potential difference alarm is met, send a terminal box potential difference alarm signal after a setting delay; after a criterion for the shielding layer ground wire overcurrent alarm is met, send a cable shielding layer overcurrent alarm signal after the setting delay; after a criterion for the armouring layer ground wire overcurrent alarm is met, send a cable armouring layer overcurrent alarm signal after the setting delay; after a criterion for the terminal box cable loop loop-current alarm is met, send a terminal box cable loop loop-current alarm signal after the setting delay; in response to determining that the ground current of the adjacent terminal box is greater than or equal to the first current alarm value, send a terminal box ground current alarm signal after the setting delay; and in response to determining that the ground current of the adjacent terminal box is greater than or equal to the second current alarm value, send an adjacent terminal box ground current alarm signal after the setting delay.

* * * * *